United States Patent
Jun et al.

(10) Patent No.: US 9,267,201 B2
(45) Date of Patent: Feb. 23, 2016

(54) ANTI-STATIC WRAPPER FOR ELECTRONIC COMPONENT WRAPPING, COATED WITH NANO FILM AND MANUFACTURING METHOD THEREOF

(71) Applicant: J&L TECH CO., LTD., Ansan-Si, Gyeonggi-Do (KR)

(72) Inventors: Youngha Jun, Ansan-Si (KR); Jaimoo Yoo, Ansan-Si (KR); Kiho Yeo, Siheung-si (KR); Jongchul Moon, Siheung-si (KR)

(73) Assignee: J&L Tech Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/316,516

(22) Filed: Jun. 26, 2014

(65) Prior Publication Data

US 2014/0305793 A1   Oct. 16, 2014

Related U.S. Application Data

(62) Division of application No. 13/166,496, filed on Jun. 22, 2011.

(30) Foreign Application Priority Data

Jun. 23, 2010   (KR) .................. 10-2010-0059355

(51) Int. Cl.
   *C23C 14/35*   (2006.01)
   *C23C 14/06*   (2006.01)
   (Continued)

(52) U.S. Cl.
   CPC ........... *C23C 14/354* (2013.01); *C23C 14/0605* (2013.01); *C23C 14/205* (2013.01); *C23C 14/221* (2013.01); *C23C 14/562* (2013.01); *C23C 16/26* (2013.01); *C23C 16/513* (2013.01); *Y10T 428/31678* (2015.04);
   (Continued)

(58) Field of Classification Search
   CPC ...................................... C23C 14/354
   USPC ................................... 204/192.15
   See application file for complete search history.

(56) References Cited

U.S. PATENT DOCUMENTS

| 6,045,916 A | 4/2000 | Shimamura et al. ........... 428/408 |
| 6,071,597 A * | 6/2000 | Yang et al. .................... 428/209 |
| 7,468,290 B2 * | 12/2008 | Lukas ................... C23C 16/401 |
| | | 257/E21.241 |
| 2004/0157067 A1 * | 8/2004 | Kusumi ................. G01R 33/02 |
| | | 428/473.5 |

FOREIGN PATENT DOCUMENTS

WO   WO 2010/050542 A1   6/2010

OTHER PUBLICATIONS

P. Lemoine; Intrinsic Mechanical Properties of Ultra-Thin Amorphous Carbon Layers; Jan. 21, 2007; Science Direct; 253; p. 6165-6175.*

H. Ziegele et al., "DCL and metallic nanometer multilayers deposited by laser-arc", 1997, Surface and Coatings Technology 97, pp. 385-390.

(Continued)

*Primary Examiner* — Tahseen N Khan
(74) *Attorney, Agent, or Firm* — Stein IP, LLC

(57) ABSTRACT

The invention is upon anti-static wrapper; specifically upon a new technology to manufacture anti-static wrapper using new materials which is different from those manufacture by spreading a surfactant or metallic materials. The aim of this invention is to manufacture a new and semi-permanent anti-static wrapper with excellent electric dissipation and adhesion to polymer film by depositing DLC film on polymer film. This invention also supplies the magnetic enhancing ion gun (MEIG) depositing device and high productive Roll-to-Roll device in which DLC film can be deposited on polymer film.

4 Claims, 3 Drawing Sheets

(51) Int. Cl.
  *C23C 14/20* (2006.01)
  *C23C 14/22* (2006.01)
  *C23C 14/56* (2006.01)
  *C23C 16/26* (2006.01)
  *C23C 16/513* (2006.01)

(52) U.S. Cl.
  CPC . *Y10T 428/31681* (2015.04); *Y10T 428/31692* (2015.04); *Y10T 428/31721* (2015.04); *Y10T 428/31786* (2015.04); *Y10T 428/31938* (2015.04)

(56) References Cited

OTHER PUBLICATIONS

P. Lemoine et al., "Intrinsic mechanical properties of ultra-thin amorphous carbon layers", Jan. 21, 2007, Applied Surface Science 253, pp. 6165-6175.

U.S. Appl. No. 13/166,496, filed Jun. 22, 2011, Youngha Jun et al., J&L Tech Co., Ltd.

* cited by examiner

ANTI-STATIC WRAPPER FOR ELECTRONIC COMPONENT WRAPPING, COATED WITH NANO FILM AND MANUFACTURING METHOD THEREOF

CROSS-REFERENCE TO RELATED APPLICATIONS

This application is a divisional of U.S. application Ser. No. 13/166,496, filed Jun. 22, 2011, which claims the benefit of Korean Application No. 10-2010-0059355, filed Jun. 23, 2010, in the Korean Intellectual Property Office. All disclosures of the document(s) named above are incorporated herein by reference.

BACKGROUND OF THE INVENTION

1. Field of the Invention

The invention is upon anti-static wrapper; specifically upon a new technology to manufacture anti-static wrapper using new materials.

2. Description of the Related Art

Anti-static wrapper is used to protect highly electronic components such as semi-conductor from static, and is used as adhesive tape. And, anti-static wrapper is also used to prevent adhesion of pollution material such as dust and to prevent static electricity.

The existing anti-static wrapper employed PVD (Physical Vapor Deposition) method using vacuum equipment by depositing aluminium (Al), nickel (Ni), copper (Cu), indum oxide ($In_2O_3$), and tin oxide (SnO) upon normal polymer film using sputter source to manufacture conductivity/static dissipating wrapper.

However, the above PVD method has problems; it has low adhesive strength of metal film deposited with polymer film during the process and/or after the process of manufacturing the wrapper so that metal film may be detached to reduce anti-static function and to contaminate surroundings.

Another method for anti-static wrapper is to adopt a surfactant, which has two methods: one is an external spread type to spread a surfactant upon the surface of polymer resin film; the other is an internal mixing type to mix an anti-static surfactant at a time when making polymer resin film. The former is low cost with fine initial performance, but has relatively low durability for it was spread on the surface of film. And, it also may contaminate other materials contacted during the use.

For internal mixing type, it has better durability with low cost and simple process. Thus it is widely used.

But, while the existing anti-static wrappers all have excellent initial performance, they become lose static dissipating capacity with the passing of certain time for their relatively poor durability.

SUMMARY OF THE INVENTION

[The Assignment to Solve]

Accordingly, the aim of this invention is to manufacture durable, lubricating and chemically unreactive wrapper with high anti-static performance.

[The Method of Solving Assignment]

The present invention may supply anti-static wrapper for electronic component wrapping in which 1-40 nm DLC (Diamond like carbon) film is coated upon 5~100 μm thick polymer film made of either Polyimide, Polyethylene, Polyethyleneterephthalate or Polypropylene, whose electric resistance ranges between $10^6$ and $10^{10}$ Ω/sq.

And, the present invention may supply anti-static wrapper for electronic component wrapping in which the above DLC film is coated on both sides of the above polymer film.

And, the present invention may supply anti-static wrapper for electronic component wrapping in which the above DLC film is doped by at least one of Al and W.

And, the present invention may supply anti-static wrapper for electronic component wrapping in which the above DLC film being a buffer layer is added by metal film.

And, the present invention may supply anti-static wrapper for electronic component wrapping in which the above metal film is added by DLC film.

And, the present invention may supply anti-static wrapper for electronic component wrapping in which polymer film is coated by DLC film and metal film repeatedly, and the final coating is made by DLC, whose whole thickness ranges between 3 and 100 nm.

And the present invention includes a step to insert polymer film into the reaction chamber; a step to vacuumize inside the reaction chamber in $10^{-3}$ or $10^{-7}$ torr; and a step to deposit DLC film on the above polymer film.

The above DLC depositing stage, employs magnetic enhanced ion gun depositing device, and Roll-to-Roll device including ion beam with cathode and gas feed manifold; proceeds continuous deposition of DLC film on the above polymer film by operating the 1st roller and the 2nd roller.

The thickness of the deposited DLC film ranges between 1 and 40 nm; and the present invention may supply anti-static wrapper for electronic component wrapping in which DLC film is deposited on polymer film, whose resistance ranges between $10^6$ and $10^{10}$ Ω/sq.

And, the present invention may supply anti-static wrapper for electronic component wrapping in which Roll-to-Roll device is used at a step of depositing the above DLC film, and DLC film is coated on both sides of the above polymer film wired in the roller of Roll-to-Roll device.

And, the present invention may supply anti-static wrapper for electronic component wrapping in which more than air among $CH_4$, $C_2H_2$, $C_6H_6$, $C_4H_{10}$ is supplied to the magnetic enhanced ion gun at the stage of depositing the above DLC film, and to allow 1000 or 2500 Voltage power is supplied to the above ion gun.

And, the present invention may supply anti-static wrapper for electronic component wrapping in which another step to deposit metal film using sputter method is included after the step of depositing the above DLC film.

THE EFFECTIVENESS

According to the present invention, anti-static wrapper having almost permanent static dissipation of $10^3$ or $10^{10}$ Ω/sq. conductivity can be manufactured, and this anti-static wrapper has a pollution resist to prevent any attachment of pollution thanks to the character of DLC film. And, Roll-to-Roll device makes the production of wrapper efficiently in terms of both time and space, which may have competitive price.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
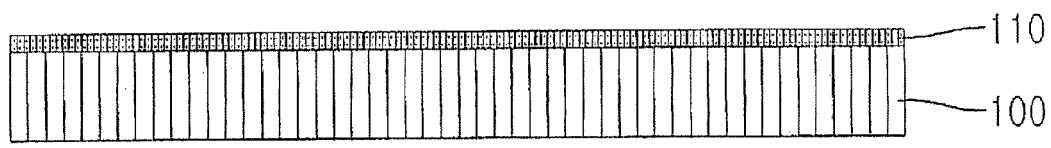
FIG. 1 is a cross-sectional drawing of anti-static wrapper according to the proper example of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

DLC (Diamond like carbon) film has a similar mechanical and optical property with diamond, but has different structure in atomic arrangement. It has high hardness and durability of abrasion with chemical stability. In particular, it can be deposited on large area substrate within 5% uniformity of deposition. It also has low coefficient of friction with high lubrication and elasticity. Accordingly, when DLC film is deposited on polymer film, it becomes to have electric dissipation property as well as the advantageous properties of DLC.

As such, anti-static wrapper as in the FIG. 1 can be made employing characteristics of DLC film.

It enables to manufacture anti-static wrapper with the resistance of $10^3$ or $10^{10}$ Ω/sq. or desirably with $10^6$ or $10^{10}$ Ω/sq. by depositing DLC film (110) on polymer film (100). The materials of DLC film (110) may have higher conductivity by doping more than one material from Si, Cu, Al, Ti, W, Cr besides normal carbon compounds.

Figure 2:
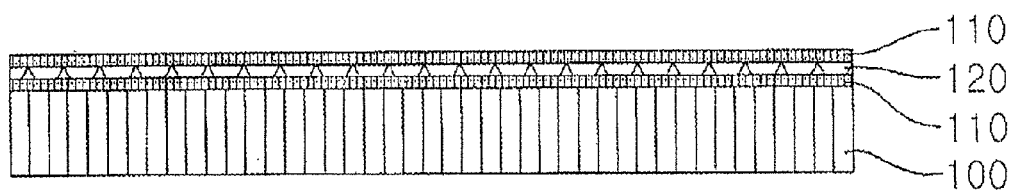
FIG. 2 is a cross-sectional drawing of anti-static wrapper according to another proper example of the present invention.

As another proper embodiment of this invention, anti-static wrapper having both conductivity and electric dissipation can be made by depositing metal film (120) on DLC film (110) as being a buffer layer, and then depositing DLC film (11) on top of it (see the FIG. 2).

Such structure enables to overcome a phenomenon that a metallic material is peeled off due to low adhesion when applying a metallic material on the polymer material. Although metal film (12) may be the final surface in case, it is recommended to finish with DLC film (11) for securing long-term adhesion.

The resistance of anti-static wrapper in FIG. 2 ranges between $10^3$ and $10^{10}$ Ω/sq. It enhances static dissipation speed by metal film buffer layer (12), and adds adhesion of DLC film (11).

It also can manufacture multi-layered wrapper by coating alternatively and repeatedly DLC film (110) and metal film (120). In such case, it is recommended to coat DLC film (110) just on polymer film (100) and to stack metal film (120) and DLC film (110) alternatively and repeatedly and finally coat DLC film (110) so that it may prevent peeling off metal film (120).

The thickness of whole layers ranges between 3 and 100 nm which is suitable in terms of preventing peeling off thin films and process time and cost.

Figure 5:
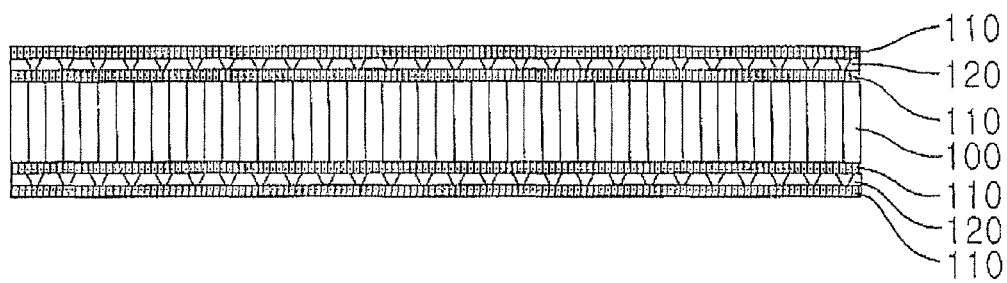
FIG. 5 is a cross-sectional drawing of anti-static wrapper with double side coating manufactured by Roll-to-Roll device.

As in FIG. 5, it makes anti-static wrapper in which both sides of polymer film (100) are deposited by DLC film (110), or deposited by DLC film (110), metal film (120) and DLC film (110). The above polymer film (100) can be selected by one of Polyimide, Polyethylene, Polyethyleneterephthalate or Polypropylene. Although the thickness of DLC film (110) ranging between 1 and 50 nm is desirable for productivity and functionality, beyond that range is available.

Hereinafter, the present invention will be described manufacturing method and device of anti-static wrapper by depositing DLC film (110) on polymer film (100).

Figure 3:
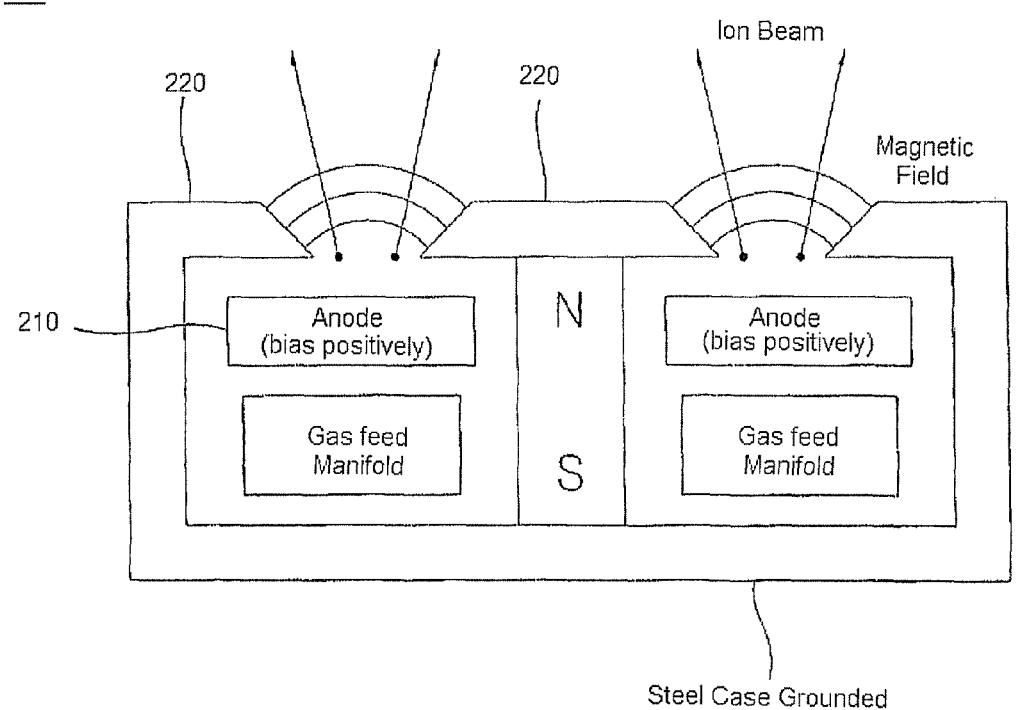
FIG. 3 is an outline drawing of ion gun used to manufacture anti-static wrapper.

FIG. 3 describes the structure of Magnetic enhanced ion gun (MEIG) according to a proper embodiment.

Either CVD, PECVD, Sputtering or Ion beam depositing can be used to manufacture DLC film, the present invention employs MEIG depositing device (see FIG. 3). MEIG depositing device can meet the requirements to relatively low process temperature to prevent from thermal deformation of polymer film, and be suitable for large area uniform deposition and has also high productivity thanks to rapid depositing speed. MEIG depositing device (200) can equip ion gun including gas feed means, power supply of ion gun and sputter device to control conductivity of wrapper by metal doping. The above ion gun consists of Anode (210) and Cathode (22). Cathode creates a magnetic field.

The present embodiment used PI and PET film as polymer film (11). The length of film is 100 m, with 5 to 100 µm thick, and the thickness of PET film was 125 µm. However such dimensions are subject to be variable according to customers' needs.

1) PI or PET film used in this embodiment is a naturally electrostatic polymer film. Polymer film (100) is cleansed to remove dust using IPA (isopropyl alcohol) before depositing on DLC film (11). But, this process can be omitted. 2) The cleansed polymer film (100) is attached to metal panel and put in the reaction chamber and fitted in jig. The reaction chamber is vacuumized in $10^{-1}$ or $10^{-6}$ torr. However, regarding film deposition on large area polymer film, the polymer film needs not be attached to a metal panel because it uses Roll-to-Roll device described in details as follows. 3) A cleaning process is performed to remove surface pollutants and activate surface of polymer film (100) using more than one ion among argon ion ($Ar^+$), oxygen ion or nitrogen ion to facilitate deposition of film. The above cleaning process is subject to change according to insertion amount of polymer film (100) and a degree of pollution, but it normally performs for less than 1 minute by allowing 1000 and 2500 Volt through power supply. 4) Next, more than one hydrocarbon gas from $CH_4$, $C_2H_2$, $C_6H_6$, $C_4H_{10}$ is supplied to MEIG depositing device (200) to deposit DLC film (110) on polymer film (100), and carbon plasma is generated by applying 1000 to 2500 Volt to the above ion gun. And, in order to control deposited ion energy and to discharge accumulated charge, −50 to −200 Volt with 50 to 350 KHz frequency is applied to the metal panel where the above polymer film (100) is attached. However, the applied voltage may be D.C. voltage or omitted, that is, although efficiency of depositing process increases due to the applying of the voltage, it is not always necessary, and therefore can be omitted to simplify the process.

Futhermore, in forming DLC film (110), DLC film (11) can be formed by doped with mixing more than one from Si, Cu, Al, Ti, W, Cr beside hydrocarbon. The doped DLC film has a better electrical conductivity compared with DLC film with hydrocarbon only. In case of Si, silane ($SiH4$) can be introduced in gaseous phase and doped, and other metallic materials can be doped using sputter method.

The thickness of the above DLC film (110) is recommended 1 to 50 nm for its characteristic performance and productivity.

The resistance of anti-static wrapper manufactured through the above process ranges between $10^3$ and $10^{10}$ Ω/sq. having electric dissipation.

Hereinafter, as another proper embodiment of present invention, it will describe depositing metal film (120) on DLC film (110) as a buffer layer after depositing DLC film (110).

The above 1), 2) and 3) steps are proceeded same and then, metal film (12) shall be deposited using sputter source after depositing DLC film (110) on polymer film (100).

Either Cr, Ti, Cu, Al, or W can be used as a metal film, Si film can be formed, and the deposition shall be made in 1 nm~5 nm thick because each metal has different conductivity. In particular, it is desirable to deposit Ti[Titanium] with 1 nm~5 nm thick, and resistance value can be controlled between $10^3$~$10^{10}$ Ω/sq. according to Ti thickness. The voltage and current capacity allowed to sputter source can be controlled to control resistance of anti-static wrapper. In this embodiment, the current capacity to sputter source was set in ranges between 0.1 and 5 A/cm². In order to accelerate ion energy forming metal film deposited on polymer film (100), it is desirable to apply −50 or −200 Volt with 50 or 350 KHz frequency on the metal panel where polymer film (100) is attached, however, such voltage may be D.C. voltage, or the voltage applying can be omitted to simplify the process and devices.

The process to deposit again DLC film (110) after depositing metal film (120) can be performed as in the step 4). Accordingly, such anti-static wrapper in FIG. 2 can be manufactured. The existence of a buffer layer can increase electrostatic dissipating speed and prevent peeling off by strengthening adhesion between metal film (120) and DLC film (110).

The resistance of anti-static wrapper with a buffer layer ranges between $10^3$ and $10^{10}$ Ω/sq. having electrostatic dissipation.

Furthermore, it is available to form a multi-layer film by depositing DLC film (110) and metal film (120) alternatively on polymer film (100) according to the depositing methods of DLC film (110) and metal film (120) aforesaid.

The MEIG depositing device (200) according to this embodiment employs linear ion source. Since such MEIG does not need any thermoelectron unlikely any other ion source, there is no increase of device temperature during the process by ion gun or ion source. Accordingly, it is suitable to deposit DLC film into polymer materials vulnerable to heat.

Furthermore, high productive Roll-To-Roll device (300) can be used to produce anti-static wrapper of the present invention.

Figure 4:
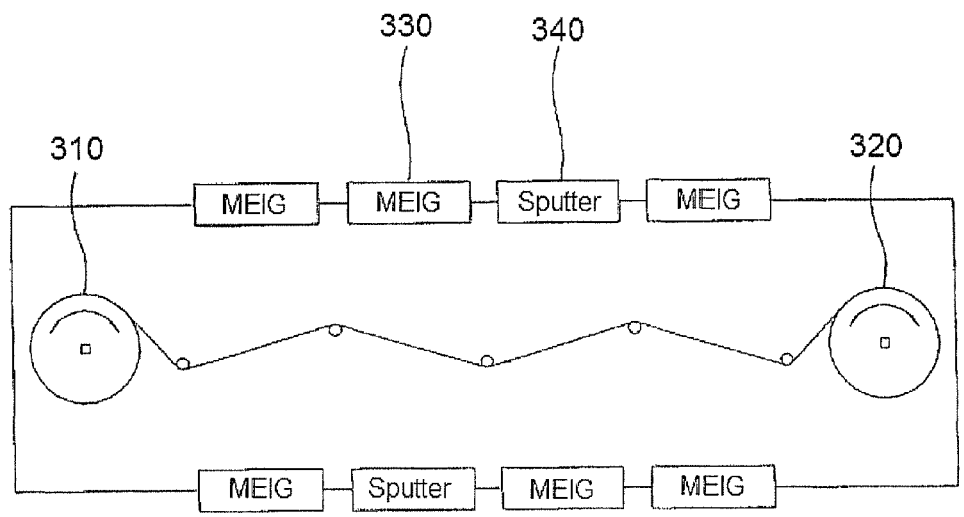
FIG. 4 is a Roll-to-Roll device drawing used to manufacture anti-static wrapper.

As in FIG. 4, polymer film (100) is rolled on the 1st roller (310) and the 2nd roller (320) placed with interval each other in the reaction chamber. DLC film (110), buffer layer of metal film (120) and/or DLC film (110) can be deposited while operating the above rollers by equipping a plurality of ion guns (330) and sputter sources (340).

Furthermore, as in FIG. 4, since the polymer film (100) is large area and may become drooping in the middle, supporting rollers can be placed in between the two rollers to keep strain polymer film (100) and to prevent drooping.

When the Roll-to-Roll device (300) is used, the productivity can be increased a lot as its processing speed is 5 m/min. DLC film (110), or both sides of DLC film (110), metal film (120) and/or DLC film (110) can be deposited easily on both sides of polymer film (100). Such Roll-to-Roll device has a price competitiveness as it reduces production cost of anti-static wrapper. FIG. 5 describes a cross-sectional drawing of anti-static wrapper with depositing layers in both sides produced by Roll-to-Roll device.

However, the present invention is not limited to the above described embodiments and is available for a variety of variation and revision within the range of keeping the essentials of the invention by the inventor.

EXPLANATION ABOUT THE NUMERALS

100: Polymer film
110: DLC (Diamond like carbon) film
120: Buffer layer
200: Ion gun depositing device
300: Roll-to-Roll device
310: The 1st roller
320: The 2nd roller
330: Ion gun
340: Sputter source

What is claimed is:

1. A method for manufacturing anti-static wrapping sheet for electronic component wrapping that comprises:
    a step to put polymer film in the reaction chamber;
    a step to vacuumize inside the reaction chamber in $10^{-3}$ or $10^{-7}$ torr; and
    a step to deposit DLC film on the said polymer film,
    wherein the said DLC depositing step employs magnetic enhanced ion gun depositing device including anode, cathode generating magnetic field, linear ion source with gas feed means and Roll-to-Roll device; and proceeds continuous deposition of DLC film on the said polymer film rolled on the Roll-to-Roll device by operating the 1st roller and the 2nd roller of the Roll-to-Roll device such that the thickness of the deposited DLC film ranges between 1 nm and 40 nm and anti-static wrapping sheet for electronic component wrapping in which DLC film is deposited on polymer film, whose resistance ranges between $10^6$ and $10^{10}$ Ω/sq.

2. The method for manufacturing anti-static wrapping sheet for electronic component wrapping according to claim 1 wherein Roll-to-Roll device is used at a step of depositing the said DLC film, and DLC film is coated on both sides of the said polymer film rolled on the roller of Roll-to-Roll device.

3. The method for manufacturing anti-static wrapping sheet for electronic component wrapping according to claim 2 wherein more than one gas among $CH_4$, $C_2H_2$, $C_6H_6$, or $C_4H_{10}$ is supplied to the magnetic enhanced ion gun at the step of depositing the above DLC film, and 1000 to 2500 Volt is applied to the said ion gun.

4. The method for manufacturing anti-static wrapping sheet for electronic component wrapping according to claim 3 wherein another step to deposit metal film using sputter method is further included after the step of depositing the DLC film.

* * * * *